(12) United States Patent
Wong et al.

(10) Patent No.: US 6,331,769 B1
(45) Date of Patent: Dec. 18, 2001

(54) RMS POWER SENSOR WITH 84 DB DYNAMIC RANGE

(75) Inventors: Vincent W. C. Wong, Morgan Hill; William W. Oldfield, Redwood City; Kenneth C. Harvey, Los Gatos, all of CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 09/336,607

(22) Filed: Jun. 18, 1999

(51) Int. Cl.[7] .............................. G01R 15/08; G01R 15/10
(52) U.S. Cl. .......................... 324/132; 324/95; 324/115; 324/119
(58) Field of Search ........................................ 324/132, 115, 324/95, 119; 455/67.1, 67.7, 115, 226.2, 226.4

(56) References Cited

U.S. PATENT DOCUMENTS

| | | | |
|---|---|---|---|
| 4,255,706 | * 3/1981 | Soojian | 324/132 |
| 4,873,484 | * 10/1989 | Adam | 324/115 |
| 4,943,764 | 7/1990 | Szente, et al. | 324/95 |

* cited by examiner

Primary Examiner—Ernest Karlsen

(74) Attorney, Agent, or Firm—Fliesler Dubb Meyer & Lovejoy LLP

(57) ABSTRACT

A power meter includes components to measure RMS power over an 84 dB range or greater using the I-V square-law relation of a diode for measurements. The power meter includes multiple diodes along with a power distribution manifold which includes power dividers to distribute an input signal to the diodes. In one embodiment, a first power divider (202) distributes power to a first one of the diodes (203), and to the second power divider (204) which distributes power to the second (210) and third (212) diodes. The first power divider (202) is connected without attenuation to the first diode (203). The second power divider (204) is connected to the second diode (210) through a 11 dB attenuator (206), and to the third diode (212) through a 28 dB attenuator (208). With such attenuation, the first diode can operate in its square law range for measurements of signals with power from −64 dBm to −14 dBm, while the second diode can operate in its square law range for signals with power from −14 dBm to +3 dBm, and the third diode can operate within its square law range for signals with power from +3 dBm to +20 dBm. By measuring the current from the appropriate diode depending on the power level of the input signal, RMS power can be determined accurately over an 84 dB operating range. In an alternative embodiment, unequal power dividers (402) and (404) are used to distribute power and eliminate the need for attenuators (206) and (208) and to provide greater operating range sensitivity.

13 Claims, 5 Drawing Sheets

TYPICAL DIODE I-V CURVE

RMS POWER SENSOR WITH 84 DB DYNAMIC RANGE

BACKGROUND OF THE INVENTION

1. Field of the Invention

The present invention relates to diode power sensors. More particularly, the present invention relates to diode power sensors designed to measure power over a wide dynamic range.

2. Description of the Related Art

Diode power sensors take advantage of a square law operating region of a diode to measure power. The current (I) vs. voltage (V) equation for a diode is typically expressed in an exponential form according to the equation $$I = I_o(e^{(\eta V/kT)} - 1) \quad (1)$$

where Io and $\eta$ are constants whose values depend on the details of the diode, T is the diode's temperature in Kelvins and k is Boltsmann's constant. FIG. 1 shows an ideal I-V curve for a Schottky or PN-Junction type diode following the parameters of equation (1).

A diode's I-V behavior can also be represented in terms of a polynomial series, $$I = \sum_{n=1}^{\infty} a_n V^n \quad (2)$$

where the $a_n$ values are chosen to suit a particular diode being considered. For a diode receiving a sinusoidal voltage, average current can be calculated using the second order term of equation (2), while other terms of equation (2) can be neglected over a portion of the diode I-V curve. Equation (2) can, thus, be simplified for average sinusoidal current as:

$$I_{avg} = a(V^2)_{avg} \quad (3)$$

The portion of the I-V curve where a diode operates according to equation (3) is referred to as the square law region.

A power sensor which measures RMS power can be constructed using a Schottky or PN-Junction diode to take advantage of the I-V square law relation of the diode. RMS power can then be determined by measuring average diode current. Power is determined according to the equation $$P = (V^2)_{avg}/2R \quad (4)$$

where P is average power, and R is the load resistance of typically 50 $\Omega$. Measured average current $I_{avg}$ from a diode is related to the average of the square of the diode voltage V according to equation (3), and the average of the square of V is related to average power using equation (4). Therefore average power P can be determined from average diode current $I_{avg}$ according to the equation $$P = I_{avg}/2aR \quad (5)$$

The power range over which a real diode operates according to the square law is limited. The typical square law operating range for a real diode is approximately $-70$ dBm to $-20$ dBm. An alternative method for measuring true RMS power is to use more expensive peak sensor/meter systems. The signal channel for these peak sensor/meter systems faithfully follows the voltage envelope for a modulated signal. Measured voltage values along the envelope are averaged to get true RMS average power. The sensor/meter systems are limited because measurements from a signal that is modulated at a higher frequency than a sensor/meter system bandwidth will produce an inaccurate measurement.

SUMMARY OF THE INVENTION

In accordance with the present invention, a diode power meter which measures RMS power using the square-law relation for a diode is provided which can measure power over a much greater range than the square-law dynamic range for a single diode.

A power meter in accordance with the present invention includes multiple diodes to enable measurement of RMS power over an 84 dB or greater range. The power meter also includes a manifold made up of power dividers to distribute an input signal to the diodes.

In one embodiment, power dividers are included in the power distribution manifold along with attenuators. In one particular version two power dividers are included with a first power divider distributing power to a first one of the diodes, and a second power divider distributing power to the second and third diodes. The first power divider is connected without attenuation to the first diode. The second power divider is connected to the second diode through an 11 dB attenuator, and to the third diode through a 28 dB attenuator. Including the 6 dB attenuation from the power dividers, the total attenuation to the first diode is 4 dB, the total attenuation to the second diode is 23 dB, and the total attenuation to the third diode is 40 dB.

With a power meter providing such attenuation, the first diode can operate in its square law range for measurements of signals with power from $-64$ dBm to $-14$ dBm, the second diode can operate in its square law range for signals with power from $-14$ dBm to $+3$ dBm, and the third diode can operate within its square law range for signals with power from $+3$ dBm to $+20$ dBm. By measuring average current from the appropriate diode, a power sensor will then have a $+20$ dBm to $-64$ dBm operating range for a total of 84 dB.

The square law power range for the second and third diodes are overlapped more to improve measurement speed for the embodiment described. A power meter requires more averaging when measuring a low detected voltage because of noise. Limiting use of lower detected voltages from the second and third diodes allows a system to be faster in a power range such as $+20$ dBm to $-14$ dBm because less averaging is needed. The trade-off is less dynamic range covered by the same number of diodes.

In an alternative embodiment, unequal power dividers are used in the distribution manifold to provide greater operating range sensitivity and to eliminate the need for separate attenuators. In one particular version two power dividers are included to distribute power to three diode detectors. A first power divider distributes power to a first one of the diodes and the second power divider, and the second power divider distributes power to the second and third diodes. The first power divider provides a $-4$ dBm attenuation to the first diode, and a $-17.86$ dBm attenuation to the second unequal divider. The second power divider then provides a $-3.14$ dBm attenuation to the second diode, and a $-20.14$ dBm attenuation to the third diode. With such attenuation, a power sensor with such unequal diodes operates from $+18$ dBm to $-66$ dBm, or over a total of 84 dB.

By taking advantage of the square law operating range of diodes, the power meter of the present invention can measure RMS power with lower cost components than a peak sensor/meter system because of the high cost associated in building a wide video bandwidth system.

BRIEF DESCRIPTION OF THE DRAWINGS

Further details of the present invention are explained with the help of the attached drawings in which.

DETAILED DESCRIPTION

In accordance with the present invention, a power detector is provided which measures RMS power over a wide dynamic range by measuring average current from one of multiple diodes. To provide accurate operation over a wide dynamic range, a greater attenuation is provided between an input signal source and each sequential diode so that each diode operates within its square law region for a different power level from the input signal.

Figure 1:
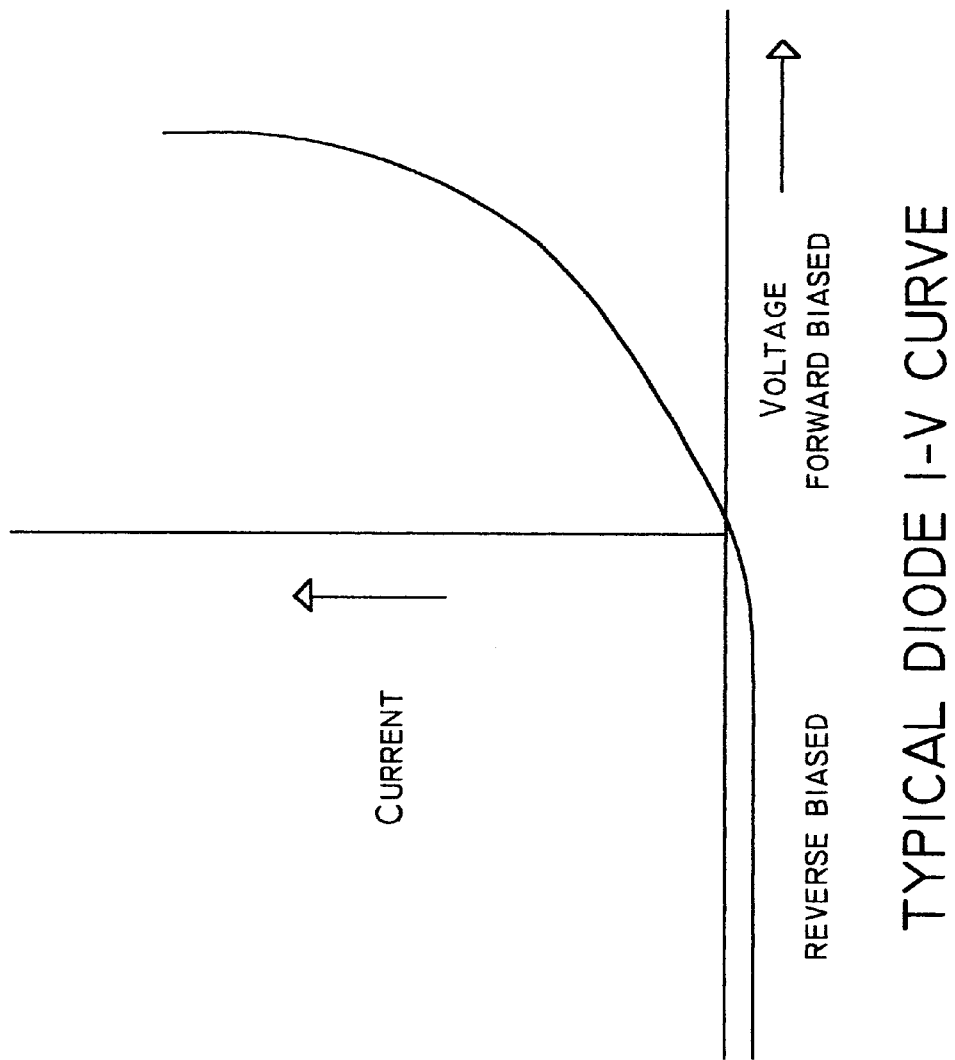
FIG. 1 shows a current vs. voltage relation for an ideal diode.
Figure 2:
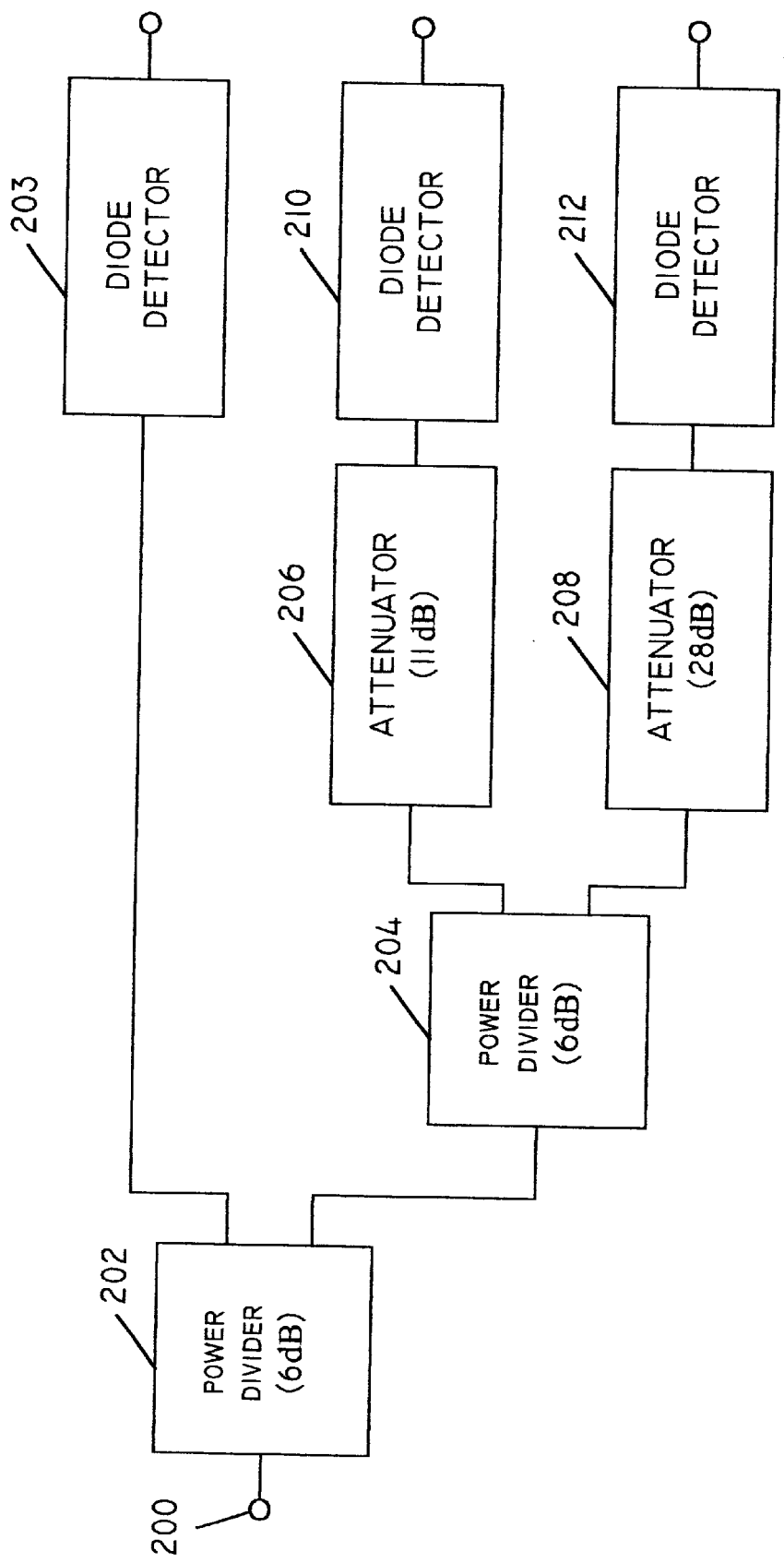
FIG. 2 shows a block diagram of components of a power meter in accordance with the present invention.

FIG. 2 shows a block diagram of components of a power meter in accordance with the present invention which uses three separate diode detectors to increase dynamic operating range. The power meter receives an input signal at the input 200. Power dividers 202 and 204 form a manifold to distribute a signal at the input 200 to detectors 203, 210 and 212. The power divider 202 divides the signal at input 200 to provide inputs to diode detector 202 and the power divider 204. Because the signal at input 200 is divided in half at the outputs of power divider 200, the power divider is shown as providing 6 dB of attenuation. The power divider 204 divides the signal at its input to provide inputs to a 11 dB attenuator 206 and to a 28 dB attenuator 208. The output of attenuator 206 is then provided to diode detector 210. The output of attenuator 208 is provided to diode detector 212.

The diode detectors 203, 210 and 212 operate by providing the input power to a diode and measuring the resulting average diode current. Average diode current $I_{avg}$ is determined by providing the diode current to a capacitor of an RC circuit and measuring voltage on the capacitor. Since the average input power is related to average diode current $I_{avg}$, using the square law relation of equation (5), the average input power can be determined by measuring the voltage across the capacitor. Because the upper limit of the diode I-V curve where the square law applies is approximately −20 dBm, using multiple diode detectors with different input attenuation values enables the power meter to function accurately to higher power, and thus to a wider dynamic range. For the device of FIG. 2, total attenuation to diode detector 203 is 6 dB, the total attenuation to diode detector 210 is 23 dB, and the total attenuation to diode detector 212 is 40 dB. For input signals of −64 dBm to −14 dBm, the output from diode detector 202 will provide results in its square law operating range. For signals from −14 dBm to +3 dBm the output of diode detector 210 will provide results in its square law operating range. And for signals from +3 dBm to +20 dBm the output of detector 212 will provide results in its square law operating range.

To display a measurement result, a processor (not shown) can be used to receive the signals from detectors 202, 210 and 212 and select which output to use for displaying results depending on the power level indicated from each detector output. Alternatively, a switch may be included to connect the appropriate detector to the display for the power meter. Such a switch would be controlled by a processor which receives the output of all three detectors and connects the switch to the appropriate detector depending on its square law region.

Although FIG. 2 shows components for a power meter which distributes a signal to three diode detectors, a power meter can be designed in accordance with the present invention with more or less detectors depending on user needs. For instance, if a power meter with only a 67 dB range is needed, only two diode detectors might be used. If a range greater than 84 dB is needed, more than three detectors might be needed. Also, although diodes 210 and 212 are assumed to use a 17 dB portion of their square law region to optimize measurement speed vs. dynamic range, these diodes may operate over lower power portions of their square law regions to increase overall system dynamic range. Attenuation values may be chosen so that each diode covers a desired portion of a total dynamic range for the power meter desired.

Figure 3:
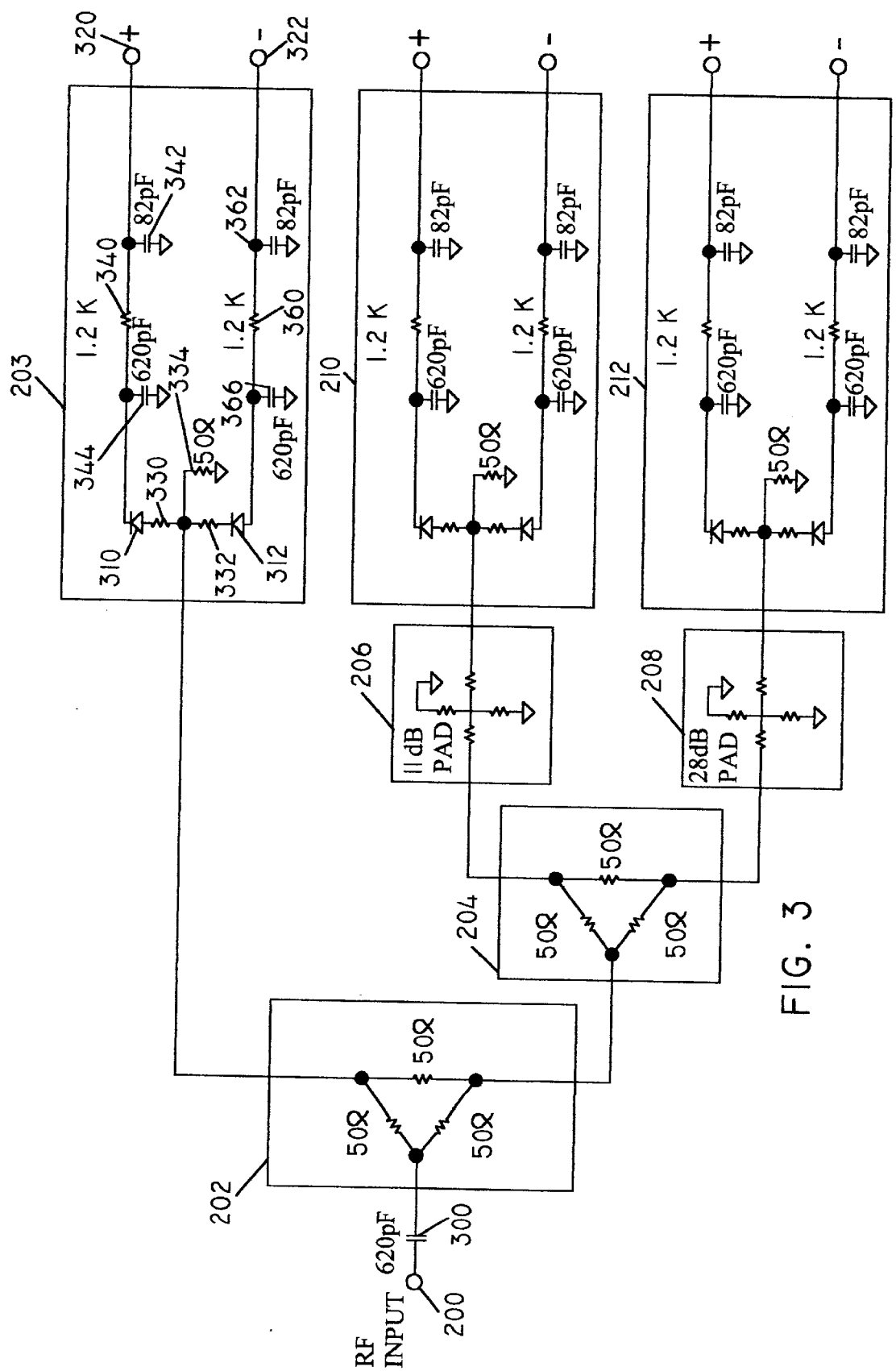
FIG. 3 shows detailed components for an embodiment of the power meter of FIG. 2.

FIG. 3 shows detailed components for an embodiment of the power meter of FIG. 2. The RF input 200 of FIG. 3 provides a signal through a small capacitor 300, shown as 620 pF, to block DC signals from the power divider input. The power dividers 202 and 204 are composed of 50 Ω resistors, one connected from a power divider input to each output, and one connected between the outputs to provide a match. The attenuators 206 and 208 each include series resistors connecting one of the power divider outputs to a diode detector input. A central terminal of the series resistors of the attenuators 206 and 208 is then connected by two parallel resistors to ground. Resistor values in the attenuators 206 and 208 are chosen to provide desired attenuation values.

Each diode detector 203, 210 and 212 in FIG. 3 has an identical configuration, so explanation of the circuitry will be described with respect to diode detector 203. The diode detector 203 includes two separate diodes 310 and 312. Diode 310 is used to provide a signal for a positive output 320 to account for a positive half of the cycles of the input signal, while diode 312 is configured to provide a signal for a negative output 322 to account for a negative half of the cycles of the input signal. The pn-diode 310 has a p-terminal connected to the output of divider 202 by a resistor 330, while diode 312 has an n-terminal connected by a resistor 332 to the output of divider 202. A 50 Ω resistor 334 connects the output of divider 202 to ground to provide shunt conductance for transmission line matching.

The n-terminal of diode 310 is connected through an RC circuit made up of resistor 330 and capacitor 344 to provide a positive output voltage. The capacitor 344 provides a voltage representative of the average current through diode 310. The RC low pass filter made of resistor 340 and capacitor 342 provides switch noise filtering to the positive voltage which is applied to output 320.

Similar to the RC circuit with resistor 330 and capacitor 344, the detector 203 includes an RC circuit with resistor 332 and capacitor 366 to provide a capacitive voltage representative of the average current through diode 312. An RC low pass filter made of resistor 360 and capacitor 362 provides switch noise filtering to the negative voltage applied to the output 322. The outputs 320 and 322 are differential outputs that minimize measurement errors introduced by thermoelectric effects from dissimilar metals.

Although detectors are shown with both positive and negative outputs, such as outputs 320 and 322, a detector with less circuitry to provide only a positive or negative output may be used. Also, although specific values for some components are shown, other values might be used depending on user design considerations.

Figure 4:
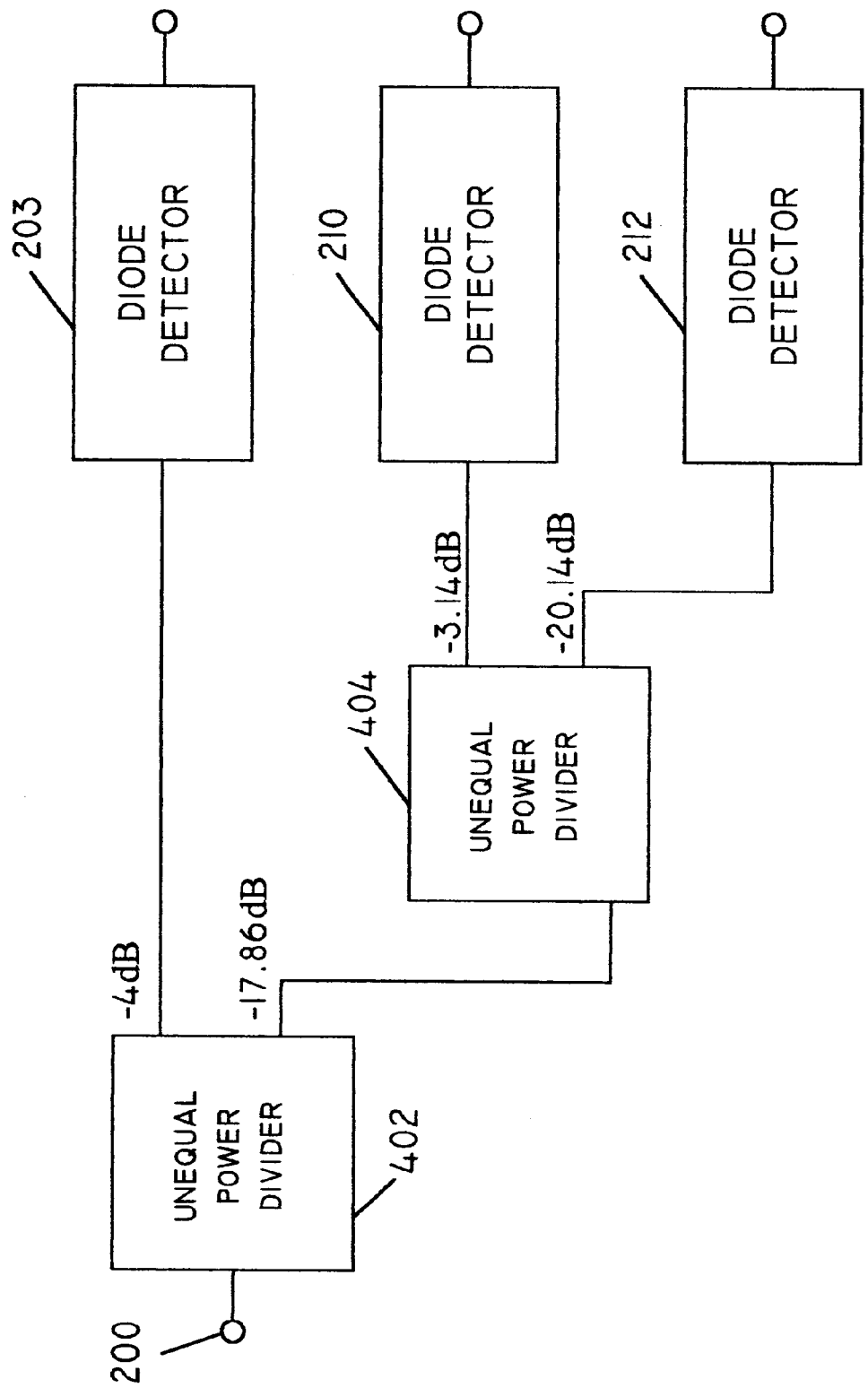
FIG. 4 shows an embodiment in accordance with the present invention which uses unequal power dividers to eliminate the need for attenuators.

FIG. 4 shows an embodiment in accordance with the present invention which uses unequal power dividers 402 and 404 to distribute a signal to diode detectors and eliminate the need for separate attenuators 203, 210 and 212. Unequal power dividers also improve sensitivity by 2 dB with attenuation values shown in FIG. 4. As shown, the unequal power divider 402 distributes an input signal from input node 200 with a −4 dB attenuation to diode detector 203, and with a −17.86 dB attenuation to the unequal power divider 404. The full 6 dB provided between the input 200 and diode detector 203 by the power divider 202 of FIG. 2 does not have to be provided since divider 402 of FIG. 4 uses an unequal power division.

The unequal power divider 404 divides the signal from the divider 402 to provide an additional −3.14 dB attenuation to diode detector 210, and an additional −20.14 dB attenuation to diode detector 212. As with the divider 404, more flexibility is provided than with the divider 204 of FIG. 2 since an attenuation other than 6 dB can be provided to each leg. With the attenuations shown provided by power dividers 402 and 404, the total attenuation provided between the input 200 and diode 203 is 4 dB, between input 200 and diode detector 210 is 21 dB, and between the input 200 and diode detector 212 is 38 dB. Although specific attenuation values are shown for the power dividers 402 and 404, other power divisions may be utilized to achieve desired attenuations between the input 200 and the diode detectors 203, 210 and 212.

Figure 5:
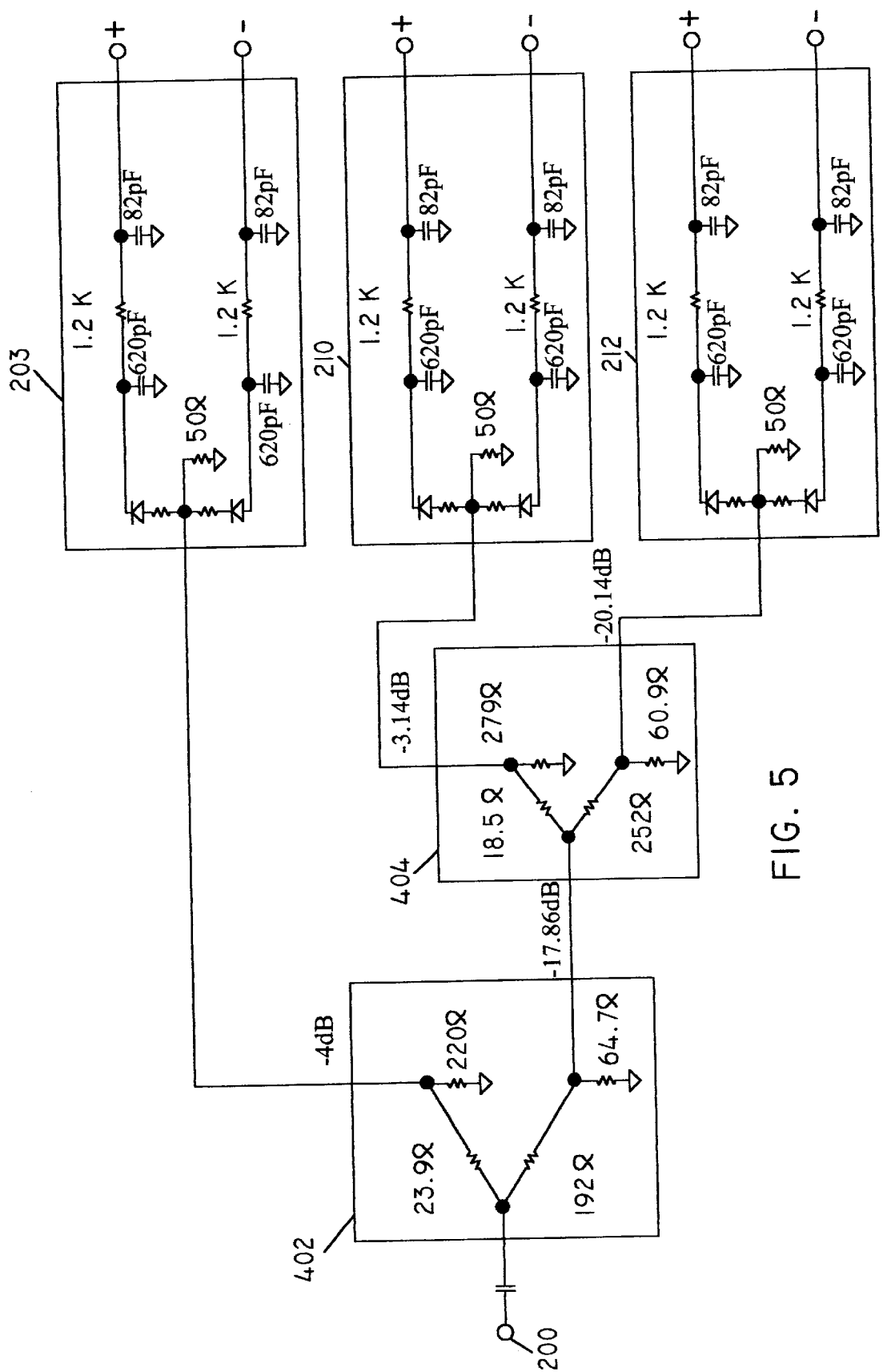
FIG. 5 shows detailed components for an embodiment of the power meter of FIG. 4.

FIG. 5 shows detailed components for the power meter of FIG. 4. As shown, the unequal divider 402 includes a 23.9 Ω resistor and a 192 Ω resistor providing the signal from the input node 200 to other terminals of the divider 402. The 23.9 Ω and 192 Ω resistors replace the equal 50 Ω resistors of the divider 202 of FIG. 2 to create the unequal −4 dB and −17.86 dB attenuations shown. A 220 Ω resistor connects one terminal of the 23.9 Ω resistor of divider 402 to ground, while a 64.7 Ω resistor connects the 193 Ω resistor to ground to provide a 50 Ω match at all terminals.

The unequal divider 404 includes a 18.5 Ω resistor and a 252 Ω resistor providing the signal from the divider 402 to diode detectors 210 and 212. The 18.5 Ω and 252 Ω resistors create the unequal −3.14 dB and −20.14 dB attenuations shown. A 279 Ω resistor connects the 18.5 Ω resistor of divider 404 to ground, while a 60.9 Ω resistor connects the 252 Ω resistor to ground to provide a 50 Ω match at all terminals of the divider 404.

Components of the diode detectors 203, 210 and 212 are the same as the components shown in FIG. 3 and function in the same manner described with respect to FIG. 3.

With a power meter providing the attenuations shown in FIGS. 4 and 5 between the input 200 and diode detectors 203, 210 and 212, a first diode in detector 203 can operate in its square law range for measurement of an input signal with power from −66 dBm to −16 dBm. Further, a diode in the detector 210 can operate in its square law range for input signal powers from −16 dBm to +1 dBm, and a diode in detector 212 can operate within its square law region from +1 dBm to +18 dBm. By measuring average current from the appropriate diode, a power sensor with components shown in FIG. 5 will have a +18 dBm to −66 dBm operating range.

The circuit with component values shown in FIG. 5 will thus have 2 dB more sensitivity than the components shown in FIG. 3, and will not require separate attenuators.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A power sensor comprising:

diode detectors, each having an input, and having an output providing an output of the power sensor; and a power distribution manifold having an input forming an input to the power sensor and at least three outputs, each one of the three outputs coupled to the input of a respective one of the diode detectors, the power distribution manifold for distributing a signal provided from the input of the power sensor to the diode detectors so that a different attenuation is provided between the power sensor input and each one of the diode detectors, the different attenuation values set so that a greater overlap of diode square law operation range occurs between a first two of the diode detectors which receive a signal from the power sensor input with a higher combined attenuation than a second two of the diode detectors.

2. The power sensor of claim 1, wherein the diode detectors each comprise:

a resistor having a first terminal coupled to the input of the diode detector, and a second terminal a diode having a first terminal coupled to the second terminal of the resistor, and having a second terminal coupled to the output of the diode detector; and a capacitor coupling the second terminal of the diode to a ground connection.

3. The power sensor of claim 1, further including a filter comprising:

a second resistor coupling the second terminal of the diode to the output of the diode detector; and a capacitor coupling the output of the diode detector to a ground connection.

4. The power sensor of claim 1, wherein the diode detectors each comprise:

a first resistor having a first terminal coupled to the input of the diode detector, and having a second terminal;

a first pn-diode having a p-terminal coupled to the second terminal of the first resistor, and having an n-terminal coupled to a + output of the diode detector;

a first capacitor coupling the n-terminal of the first pn-diode to a ground connection;

a second resistor having a first terminal coupled to the input of the diode detector, and having a second terminal;

a second pn-diode having an n-terminal coupled to the second terminal of the second resistor, and having a p-terminal coupled to a − output of the diode detector; and a second capacitor coupling the p-terminal of the second pn-diode to a ground connection.

5. The power sensor of claim 4, wherein the diode detectors each further comprise:

a third resistor coupling the n-terminal of the first pn-diode to the + output of the diode detector;

a third capacitor coupling the + output of the diode detector to a ground connection;

a fourth resistor coupling the p-terminal of the second pn-diode to the − output of the diode detector; and a fourth capacitor coupling the − output of the diode detector to a ground connection.

6. The power sensor of claim 1, wherein the power distribution manifold comprises:

at least one power divider connected to distribute power from the input of the power sensor to an input of each of the diode detectors.

7. The power meter of claim 6, wherein the power distribution manifold further comprises at least one attenuator, each attenuator connecting a power divider output to the input of one of the diode detectors.

8. The power sensor of claim 6, wherein the at least one power divider provides an unequal power division to enable the different attenuation to be provided between the power sensor input and each one of the diode detectors.

9. A power sensor comprising:

a power divider having an input forming an input to the power sensor, and having first and second outputs with an unequal power division provided between the input of the power divider and its first and second outputs;

a first resistor having a first terminal coupled to the first output of the power divider, and having a second terminal;

a first diode having a first terminal coupled to the second terminal of the first resistor, and having a second terminal coupled to a first output of the power sensor;

a first capacitor coupling the second terminal of the first diode to a ground connection;

a second resistor having a first terminal coupled to the second output of the power divider, and having a second terminal;

a second diode having a first terminal coupled to the second terminal of the second resistor, and having a second terminal coupled to a second output of the power sensor; and a second capacitor coupling the second terminal of the second diode to a ground connection.

10. The power sensor of claim 9 further comprising:

a third resistor coupling the second terminal of the first diode to the first output of the power sensor;

a third capacitor coupling the first output of the power sensor to a ground connection;

a fourth resistor coupling the second terminal of the second diode to the second output of the power sensor; and a fourth capacitor coupling the second output of the power sensor to a ground connection.

11. A power sensor comprising:

a first power divider having an input forming an input to the power sensor, and having first and second outputs with an unequal power division provided between the input and the first and second outputs;

a second power divider having an input coupled to the first input of the first power divider, and having first and second outputs with an unequal power division provided between the input of the second power divider and its first and second outputs;

a first resistor having a first terminal coupled to the second output of the first power divider, and having a second terminal;

a first diode having a first terminal coupled to the second terminal of the first resistor, and having a second terminal coupled to the first output of the power sensor;

a first capacitor coupling the second terminal of the first diode to a ground connection;

a second resistor having a first terminal coupled to the first output of the second power divider, and having a second terminal;

a second diode having a first terminal coupled to the second terminal of the second resistor, and having a second terminal coupled to the second output of the power sensor;

a second capacitor coupling the second terminal of the second diode to a ground connection;

a third resistor having a first terminal coupled to the second output of the second power divider, and having a second terminal;

a third diode having a first terminal coupled to the second terminal of the third resistor, and having a second terminal coupled to the third output of the power sensor; and a third capacitor coupling the second terminal of the third diode to a ground connection.

12. The power sensor of claim 11 further comprising:

a fourth resistor coupling the second terminal of the first diode to the first output of the power sensor;

a fourth capacitor coupling the first output of the power sensor to a ground connection;

a fifth resistor coupling the second terminal of the second diode to the second output of the power sensor;

a fifth capacitor coupling the second output of the power sensor to a ground connection;

a sixth resistor coupling the second terminal of the third diode to the third output of the power sensor; and a sixth capacitor coupling the third output of the power sensor to a ground connection.

13. A power sensor comprising:

diode detectors, each having an input, and having an output providing an output of the power sensor;

a power distribution manifold having an input forming an input to the power sensor and outputs coupled to the inputs of the diode detectors, the power distribution manifold for distributing a signal provided from the input of the power sensor to the diode detectors so that a different attenuation is provided between the power sensor input and each one of the diode detectors, wherein the power distribution manifold comprises at least one power divider connected to distribute power from the input of the power sensor to an input of each of the diode detectors, and wherein the at least one power divider provides an unequal power division to enable the different attenuation to be provided between the power sensor input and each one of the diode detectors.

* * * * *